(12) United States Patent
Chua et al.

(10) Patent No.: US 9,577,047 B2
(45) Date of Patent: Feb. 21, 2017

(54) INTEGRATION OF SEMICONDUCTOR EPILAYERS ON NON-NATIVE SUBSTRATES

(71) Applicant: Palo Alto Research Center Incorporated, Palo Alto, CA (US)

(72) Inventors: Christopher L. Chua, San Jose, CA (US); Qian Wang, Palo Alto, CA (US); Brent S. Krusor, Fremont, CA (US); JengPing Lu, Fremont, CA (US); Scott J. Limb, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 14/796,440

(22) Filed: Jul. 10, 2015

(65) Prior Publication Data

US 2017/0012101 A1    Jan. 12, 2017

(51) Int. Cl.
*H01L 29/205* (2006.01)
*H01L 29/20* (2006.01)
*H01L 29/267* (2006.01)
*H01L 21/02* (2006.01)

(52) U.S. Cl.
CPC ........ *H01L 29/205* (2013.01); *H01L 21/0254* (2013.01); *H01L 21/02532* (2013.01); *H01L 21/02543* (2013.01); *H01L 21/02546* (2013.01); *H01L 21/02664* (2013.01); *H01L 29/2003* (2013.01); *H01L 29/267* (2013.01)

(58) Field of Classification Search
CPC . H01L 29/205; H01L 21/0254; H01L 29/267; H01L 21/02664; H01L 21/02532; H01L 21/02543; H01L 21/02546; H01L 29/2003
See application file for complete search history.

(56) References Cited

U.S. PATENT DOCUMENTS

| | | |
|---|---|---|
| 3,397,278 A | 8/1968 | Pomerantz |
| 4,102,664 A | 7/1978 | Dumbaugh, Jr. |
| 4,598,274 A | 7/1986 | Holmes |
| 5,374,564 A | 12/1994 | Bruel |
| 7,002,517 B2 | 2/2006 | Noujeim |
| 7,153,758 B2 | 12/2006 | Hata et al. |
| 7,554,085 B2 | 6/2009 | Lee |
| 8,130,072 B2 | 3/2012 | De Bruyker et al. |
| 2004/0222500 A1* | 11/2004 | Aspar ............ B81C 99/008 257/629 |

(Continued)

FOREIGN PATENT DOCUMENTS

WO    WO0143228    6/2001

*Primary Examiner* — Bilkis Jahan
*Assistant Examiner* — Victor Barzykin
(74) *Attorney, Agent, or Firm* — Hollingsworth Davis, LLC

(57) ABSTRACT

An article includes a support substrate bonded to heterostructure epitaxial layers that include one or more electronic devices. The support substrate has a bonding surface and the heterostructure epitaxial layers have a surface with the epitaxial growth direction of the heterostructure epitaxial layers towards the surface. The surface of the heterostructure epitaxial layers is bonded at the bonding surface of the support substrate by ion exchange between the surface of the heterostructure epitaxial layers and the bonding surface of the support substrate.

21 Claims, 19 Drawing Sheets

(56) References Cited

U.S. PATENT DOCUMENTS

| | | |
|---|---|---|
| 2006/0270190 A1* | 11/2006 | Nastasi ............ H01L 21/76254 |
| | | 438/458 |
| 2008/0311686 A1 | 12/2008 | Morral et al. |
| 2009/0086170 A1* | 4/2009 | El-Ghoroury .......... B82Y 20/00 |
| | | 353/38 |
| 2013/0140649 A1 | 6/2013 | Rogers et al. |
| 2014/0266946 A1 | 9/2014 | Bily et al. |
| 2014/0300520 A1 | 10/2014 | Nguyen et al. |
| 2014/0323968 A1 | 10/2014 | Rogers et al. |
| 2015/0102852 A1* | 4/2015 | Limb ..................... H01L 23/14 |
| | | 327/525 |
| 2015/0229028 A1 | 8/2015 | Bily et al. |
| 2015/0318618 A1 | 11/2015 | Chen et al. |
| 2015/0372389 A1 | 12/2015 | Chen et al. |

* cited by examiner

U.S. 9,577,047 B2

INTEGRATION OF SEMICONDUCTOR EPILAYERS ON NON-NATIVE SUBSTRATES

STATEMENT REGARDING FEDERALLY SPONSORED RESEARCH AND DEVELOPMENT

This invention is based upon work supported by DARPA under Contract No. HR0011-14-C-0013 (3765). The Government has certain rights to this invention.

TECHNICAL FIELD

This disclosure relates generally to articles comprising epitaxially grown semiconductor heterostructure layers bonded to non-native substrates and to related methods.

BACKGROUND

Monolithically integrating compound semiconductor devices such as laser diodes, light emitting diodes, and heterojunction transistors onto non-native substrates can open the door to many useful applications of these devices. However, most compound semiconductor devices require high quality epitaxially grown layers that can only be attained by crystalline growth on a lattice-matched or lattice-compatible substrate. This substrate restriction severely limits the functionality and application flexibility of many semiconductor devices.

BRIEF SUMMARY

Some embodiments are directed to an article comprising a support substrate having bonding surface and heterostructure epitaxial layers that include one or more electronic devices. The heterostructure epitaxial layers have a surface and an epitaxial growth direction towards the surface. The heterostructure epitaxial layers are bonded to the support substrate at the surface of the heterostructure epitaxial layers by ion exchange between the surface of the heterostructure epitaxial layers and the bonding surface of the support substrate.

Some embodiments involve a method that includes epitaxially growing heterostructure epitaxial layers on a growth substrate along a growth direction towards a surface of the heterostructure epitaxial layers. The surface of the heterostructure epitaxial layers is placed directly on or near an ion rich bonding surface of a support substrate. The heterostructure epitaxial layers are bonded to the support substrate by ion exchange between the bonding surface of the support substrate and the surface of the heterostructure epitaxial layers. At least one of heat and voltage are applied during the bonding. Before and/or after the bonding, the growth substrate is removed.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to structures and techniques that enable high quality semiconductor epilayers to be realized on non-native and non-crystalline substrates. The approaches disclosed herein involve epitaxially growing the semiconductor heterostructure epilayers, such as GaAs, InP, Si, or GaN layers, on their native crystalline growth substrate or other growth substrate that provides for lattice compatibility or lattice matching between the growth substrate and the semiconductor epilayers. The heterostructure epilayers grow on the growth substrate in a direction towards a surface of the heterostructure epilayers. This surface is placed against or near an ion rich bonding surface of a support substrate. The heterostructure epilayers are bonded to the support substrate using one or both of heat and a bias voltage to drive ion exchange across the interface between the heterostructure epilayers and the support substrate. The growth substrate is removed from the heterostructure epilayers before and/or after the bonding, leaving just the thin heterostructure epilayers bonded on the support substrate.

Figure 1A:
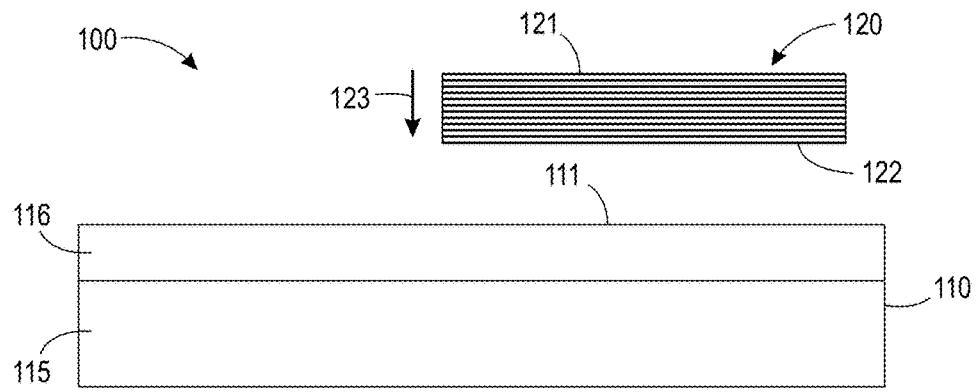
FIG. 1A shows an exploded view of an article in accordance with some embodiments.

FIG. 1A shows an exploded view of an article in accordance with some embodiments. The article 100 includes a support substrate 110 having a stress engineered, ion rich bonding surface 111 and epitaxially grown heterostructure layers 120 that include one or more electronic devices. An exemplary, non-limiting set of ions at the ion-rich bonding surface include lithium (Li), sodium (Na), potassium (K), copper (Cu), silver (Ag), rubidium (Rb) and cesium (Cs).

In some embodiments, the electronic devices may include one or more of GaAs, InP, Si, and GaN-based electronic devices, such as a laser diode, a light-emitting diode, a diode, a transistor, a photodetector, a light guide, a semiconductor optical amplifier, an electronic switch, a field-effect device, and/or a modulator.

The heterostructure epilayers 120 may be less than about 10 µm thick having surface 122 with an epitaxial growth direction 123 towards the surface 122. In some embodiments, an etch stop layer 121 is disposed opposite the surface 122. The surface 122 of the heterostructure epilayers disposed directly on or in close proximity to the bonding surface 111 of the support substrate 110.

In some embodiments, the support substrate is engineered to powderize, e.g., fracture into very small particles such that each dimension of a particle, length, width, and height, is less than about 900 µm, less than about 500 µm, or even less than about 100 µm. The fracturing of the support substrate may be initiated by a thermal or mechanical trigger event, for example. In some embodiments, the trigger event may be initiated remotely by a wired or wireless connection that provides a trigger input, e.g., an electrical signal.

Figure 1B:
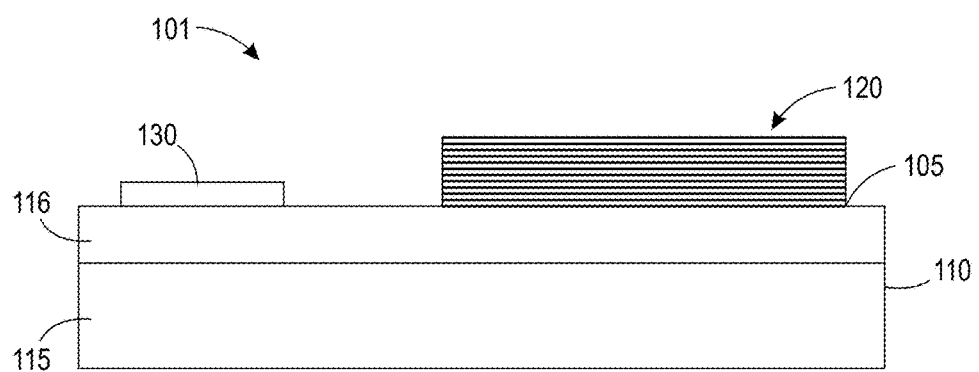
FIG. 1B shows an article in accordance with some embodiments after the heterostructure epilayers are bonded to the support substrate at the bonding interface between the bonding surface of the support substrate and the surface of the heterostructure epilayers.

The bond between the heterostructure epilayers and the support substrate may be made sufficiently intimate so that the heterostructure epilayers powderize with the support substrate. FIG. 1B shows an article 101 after the heterostructure epilayers 120 are bonded to the support substrate 110 at the bonding interface 105 between the bonding surface of the support substrate and the surface of the heterostructure epilayers. In the illustrated embodiment, the article 101 includes a trigger mechanism 130 configured to provide the trigger event that initiates the fracturing of the support substrate 110. For example, in some embodiments, the trigger mechanism 130 may comprise a piezoelectric element configured to provide a mechanical trigger event in response to an electrical trigger input signal. In some embodiments, the trigger mechanism is a resistive element configured to provide a thermal trigger event in response to an electrical trigger input signal.

The process used in preparing the support substrate 110, e.g., chemical tempering, imparts a large stress gradient within the thickness of the support substrate 110. This stored mechanical energy is abruptly released when a trigger event, e.g., mechanical, electrical, optical, or thermal trigger event, causes the support substrate to fracture. The resulting shock wave aids in producing the desired outcome of breaking the bonded heterostructure epilayers 120 and in reducing the size of the broken pieces.

Figure 2:
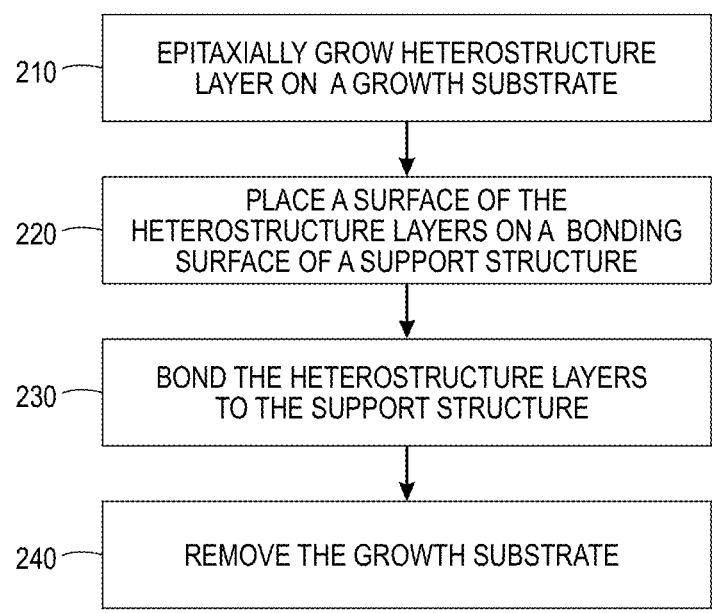
FIG. 2 is a flow diagram of a method of making articles such as those illustrated in FIGS. 1A and 1B.

FIG. 2 is a flow diagram of a method of making articles such as those illustrated in FIGS. 1A and 1B, for example. Heterostructure epilayers that include one or more electronic devices are grown 210 on a growth substrate. The electronic devices may be formed through metal organic vapor phase epitaxy (MOCVD), or other techniques. In some embodiments, the electronic devices may include one or more of GaAs, InP, Si, and GaN-based electronic devices, such as a laser diode, a light-emitting diode, a diode, a heterojunction transistor, a photodetector, a light guide, a semiconductor optical amplifier, an electronic switch, a field-effect device, and/or a modulator.

The growth substrate may comprise the same semiconductor material as the heterostructure epilayers, or may comprise a material that is different from the material of the heterostructure epilayers, but which is sufficiently lattice compatible or lattice matched to provide high quality, low defect epilayers. The heterostructure epilayers have a growth direction that proceeds towards a surface of the heterostructure epilayers.

The surface of the heterostructure epilayers is placed 220 on or over an ion rich bonding surface of the support substrate that facilitates bonding through ion transport. In some embodiments, the surface of the heterostructure epilayers is placed directly on the bonding surface of the support substrate. In some embodiments a thin intermediate layer is disposed between the surface of the heterostructure epilayers and the bonding surface of the support substrate. In embodiments that use the intermediate layer, the intermediate layer is made sufficiently brittle and thin, e.g., less than about 1 µm, so that the intermediate layer does not impede the powderization of the heterostructure epilayers.

The heterostructure epilayers and the support substrate are bonded 230 by ion exchange at the bonding interface between the surface of the heterostructure epilayers and the bonding surface of the support substrate. In some embodiments, a voltage is applied e.g., a voltage of 500 to 1200 V applied for about 2 to 5 minutes of hold time, across the bonding interface to drive ions across the interface. Alternatively or additionally, in some embodiments, the article is heated during the bonding process to 300 to 400° C. which promotes movement of ions across the interface. The resulting bond is sufficiently strong and uniform so that the growth substrate can be selectively removed 240 in a process that does not damage the heterostructure epilayers. Removal of the growth substrate may occur before and/or after the bonding and may be complete or partial removal. The growth substrate may be removed from the heterostructure epilayers, for example, by chemical polishing, plasma etching, and/or chemical etching. In some embodiments, e.g., when sapphire is used as the growth substrate, the heterostructure epilayers may be separated from the growth substrate by laser lift-off. The heterostructure epilayers may include an etch stop layer to control the etch process.

Returning now to FIGS. 1A and 1B, the support substrate 110 is a wafer-like structure including at least one tensile stress layer 116 having a residual tensile stress and at least one compressive stress layer 115 having a residual compressive stress. Tensile stress layer 116 and compressive stress layer 115 (collectively referred to herein as "stress-engineered layers") are operably integrally connected together such that residual tensile and compressive stresses are self-equilibrating and produce a stress gradient. As set forth in additional detail below, the stress-engineered layers 116 and 115 are fabricated either by post-treating a substrate material using strategies similar to glass tempering (e.g., by way of heat or chemical treatment), or by depositing the substrate layers using, for example chemical, vapor deposition techniques in which the deposition parameters (i.e., temperature, pressure, chemistry) are varied such that the layers collectively contain a significant inbuilt stress gradient. Note that the arrangement of stress-engineered layers 116 and 115 indicated in FIGS. 1A and 1B is not intended to be limiting in that one or more non-stressed substrate layers may be disposed between the two stress-engineered layers.

Various methods may be used to generate the stressed support substrate. A first approach involves thin film sputter deposition. In thin film sputter deposition, generally two distinct regimes can be identified leading to very different film morphology and characteristics, and result in either compressive or tensile stress. Metals are often used because of functionality (e.g., electrical properties), their structural qualities (e.g., ductility), and the fact that a conductive sputter target allows for a simple, high yield, glow discharge DC magnetron sputtering process. However, stress-engineered metal oxides and glasses (silicon oxides) can be sputtered as well; these insulating or semiconducting films can be sputter deposited by either radiofrequency (RF) sputtering or by reactive sputtering in a mixed inert/reactive gas plasma (e.g. argon/oxygen).

To achieve reliable powderization yielding fragmentation particles in any dimension, a method for generating stressed support substrates involves adapting stress-engineered thin film fabrication techniques with ion-exchange tempering to create optimal stress profiles in glass (SiO2) substrates, e.g., glass (SiO2) substrates.

Figure 3A:
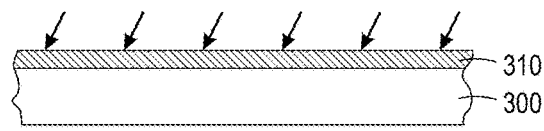
FIGS. 3A to 3E illustrate a first methodology in which a stressed support substrate is fabricated in accordance with some embodiments.
Figure 3B:
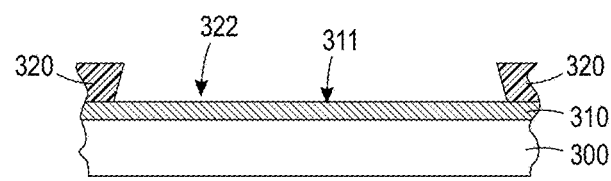
Figure 3C:
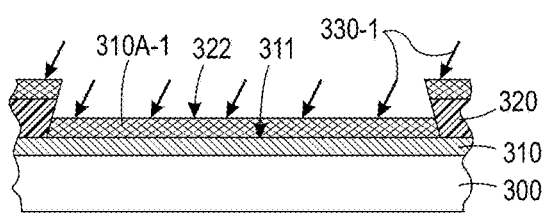
Figure 3D:
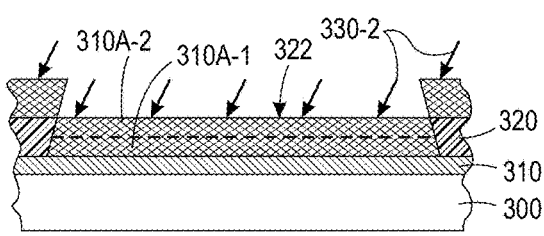
Figure 3E:

FIGS. 3A to 3E illustrate a first methodology in which a stressed support substrate 310A is built up by patterned $SiO_2$ stressed support substrates generated entirely using plasma vapor deposition (PVD) techniques. This method provides a high degree of control over the specific stress profile generated in the stressed support substrate and provides for continuous control over glass formulation and morphology through the thickness dimension of the stressed support substrate. Referring to FIG. 3A, a wafer 300 (e.g., silicon or other material) is coated with a release layer 310, most likely a metal. In FIG. 3B, a thick liftoff mask 320 is then patterned on release layer 310 such that mask 320 defines an opening 322. Note that wafer 300, release layer 310, and mask 320 form a sacrificial structure. Referring to FIGS. 3C and 3D, PVD processing is then used to create the stress engineered layers 310A-1 and 310A-2 in opening 322, placing stresses in the deposited substrate material 330-1 and 330-2, for example, by altering the process parameters (e.g., using different temperatures T1 and T2 and/or pressures P1 and P2). Finally, as indicated in FIG. 3E, the mask is then lifted off, and stressed substrate 310A is singulated (removed) from the remaining sacrificial structure by under-etching the release layer.

Figure 4A:
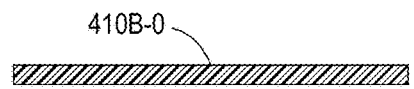
FIGS. 4A to 4E illustrate a second methodology in which a stressed support substrate is fabricated in accordance with some embodiments.
Figure 4B:
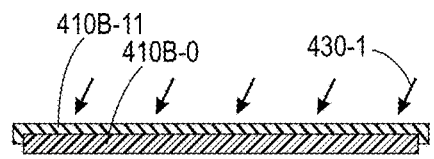
Figure 4C:
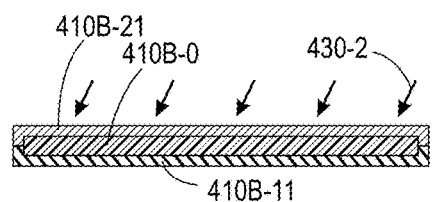
Figure 4D:
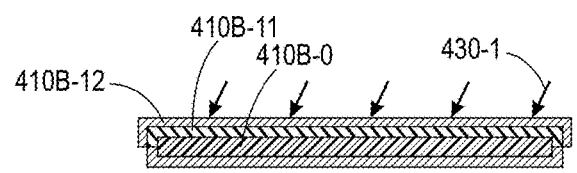
Figure 4E:
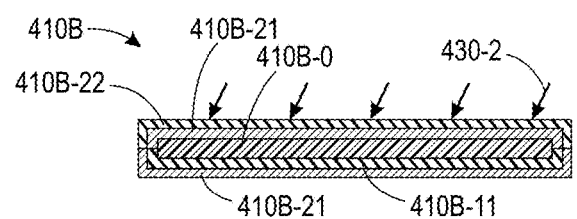

FIGS. 4A to 4E illustrate a second methodology in which a stressed support substrate 410B is built up by patterned $SiO_2$ on a thin glass core using PVD techniques. This methodology provides a high degree of control over the specific stress profile generated in the stressed support substrate. Referring to FIG. 4A, the process begins using a substantially unstressed glass core substrate 410B-0 having a thickness T0 in the range of 25 μm and 100 μm. Suitable glass core substrates are currently produced by Schott North America, Inc. of Elmsford, N.Y., USA). Referring to FIGS. 4B to 4E, $SiO_2$ is then deposited on alternating sides of core substrate 410B-0 via PVD using methods similar to those described above. Specifically, FIG. 4B shows the deposition of material 430-1 in a manner that forms stress-engineered layer 410B-11 on core substrate 410B-0. FIG. 4C shows the deposition of material 430-2 in a manner that forms stress-engineered layer 410B-21 on an opposite side of core substrate 410B-0. FIG. 4C shows the subsequent deposition of material 430-1 in a manner that forms stress-engineered layer 410B-12 on core layer 410B-11, and FIG. 4E shows the deposition of material 430-2 in a manner that forms stress-engineered layer 410B-22 layer 410B-21. FIG. 4E shows completed stressed support substrate 410B including core substrate (central, substantially unstressed layer) 410B-0 with stress-engineered layers 410B-11, 410B-12, 410B-21 and 410B-22 formed thereon.

Figure 5A:
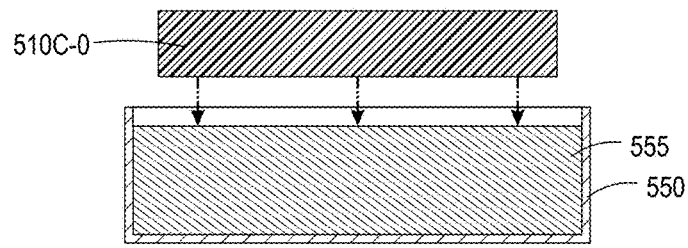
FIGS. 5A to 5E illustrate a third methodology in which a stressed support substrate is fabricated in accordance with some embodiments.
Figure 5B:
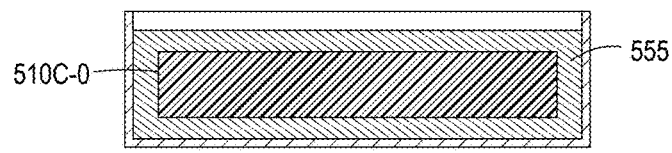
Figure 5C:
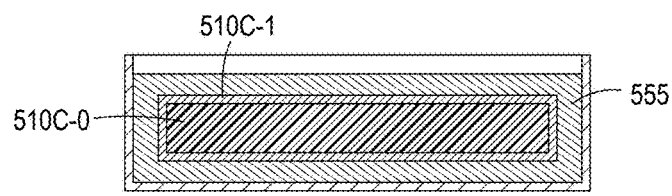
Figure 5D:
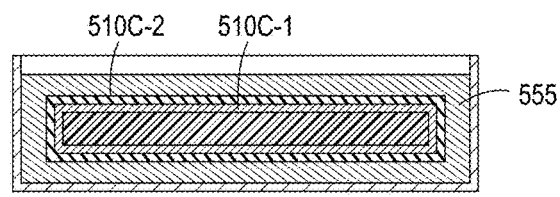
Figure 5E:
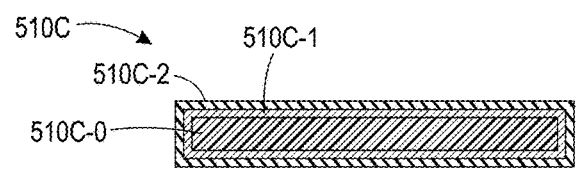

FIGS. 5A to 5E illustrate a third methodology in which a stressed support substrate 510C is produced by subjecting a core substrate to one of an ion-exchange tempering treatment, a chemical treatment and a thermal treatment. Specifically, FIGS. 5A to 5E illustrate an exemplary ion-exchange tempering treatment during which various stress profiles are introduced in a core substrate via molten-salt ion exchange. FIG. 5A shows a core substrate 510C-0 over a vat 550 containing a molten-salt solution 555. FIG. 5B shows core substrate 510C-0 immediately after submersion in molten-salt solution 2555, FIG. 5C shows core substrate 510C-0 after a first time period of submersion in molten-salt solution 555 in which a first stress-engineered layer 510C-1 is formed, and FIG. 5D shows the structure after a second time period of submersion in molten-salt solution 555 in which a second stress-engineered layer 510C-2 is formed on first stress-engineered layer 510C-1. FIG. 5E shows completed stressed support substrate 500C including central core substrate 510C-0 and stress-engineered layers 510C-1 and 510C-2.

According to a fourth methodology, a hybrid of the above second and third methods is employed in which diced, thin glass core substrates are ion-exchange tempered, and then multiple layers of SiO2 are deposited on the tempered substrates to further increase the induced stresses.

EXAMPLES

Transfer of GaAs, InP and GaN heterostructure epilayers onto stress engineered, ion-exchanged glass substrates was demonstrated in examples 1, 2, and 3, respectively. The glass substrates used had an engineered ion-rich (potassium ions) bonding surface that facilitated bonding the heterostructure epilayers through ion transport across the bonding interface.

The heterostructure epilayers used included various devices grown by metal organic vapor phase epitaxy (MOCVD) on their native substrates.

Example 1

Figure 6A:
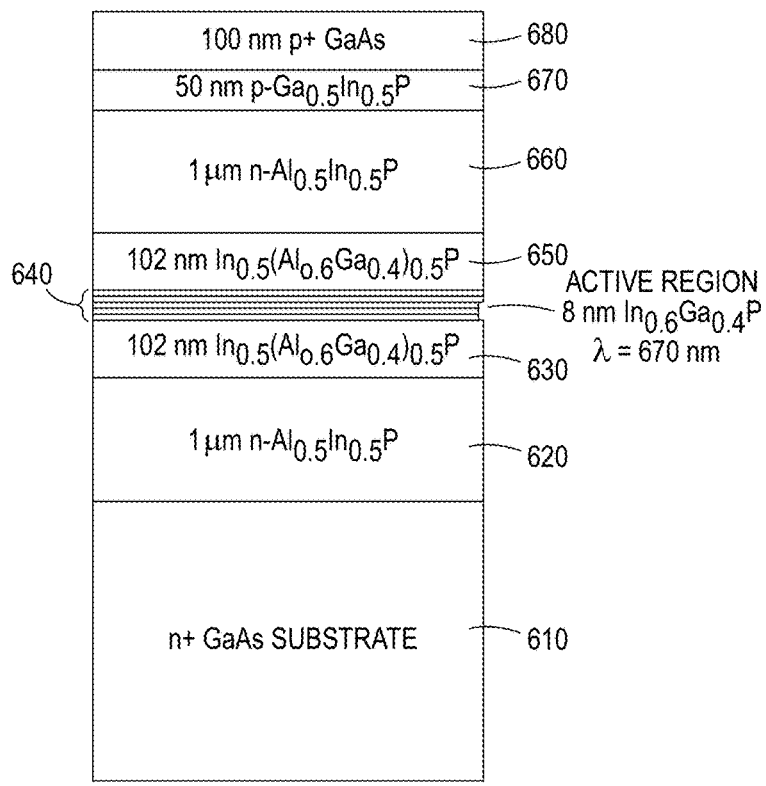
FIG. 6A shows a diagram of the heterostructure epilayer stack of example 1.
Figure 6B:
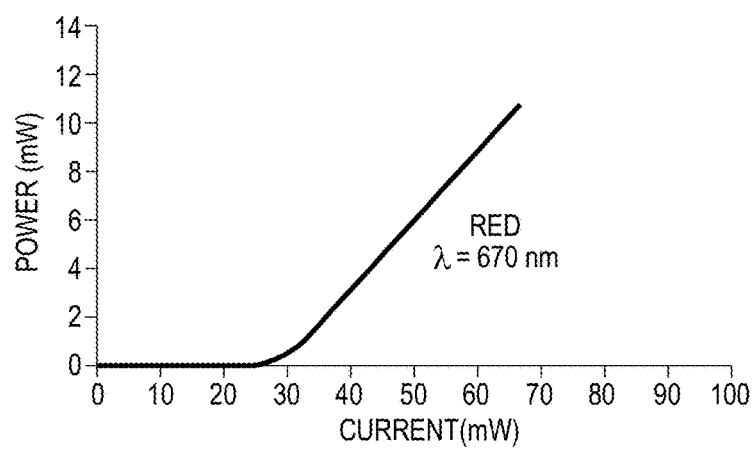
FIG. 6B shows the light versus current curve of a red-emitting laser diode fabricated using the heterostructure epilayers of FIG. 6A.

In a first example, a GaAs semiconductor laser heterostructure was bonded to the previously described chemically tempered glass as the support substrate. The heterostructure epilayers were grown on a 400 µm-thick n+ GaAs growth substrate 610 by MOCVD, and featured lattice-matched AlInP cladding layers 620, 660. The active region 640 included InAlGaP multiple quantum wells (MQW) designed to emit in the red ($\lambda \approx 670$ nm) wavelength range. The total thickness of the epilayer was about 2.6 µm. FIG. 6A shows a detailed diagram of the heterostructure epilayer stack which included the following layers disposed on the growth substrate 610: 1 µm n-$Al_0.5In_0.5P$ layer 620; 102 nm $In_{0.5}(Al_{0.6}Ga_{0.4})_{0.5}P$ layer 630; 8 nm active region 640 comprising multiple $In_{0.6}Ga_{0.4}P$ quantum wells emitting at $\lambda=670$ nm; 102 nm $In_{0.5}(Al_{0.6}Ga_{0.4})_{0.5}P$ layer 650; 1 µm n-$Al_{0.5}In_{0.5}P$ layer 660; 50 nm p-$Ga_{0.5}In_{0.5}P$ layer 670; and 100 nm p+ GaAs layer 680. FIG. 6B shows the light versus current curve of a red-emitting laser diode fabricated using the heterostructure epilayers of FIG. 6A.

Figure 7A:
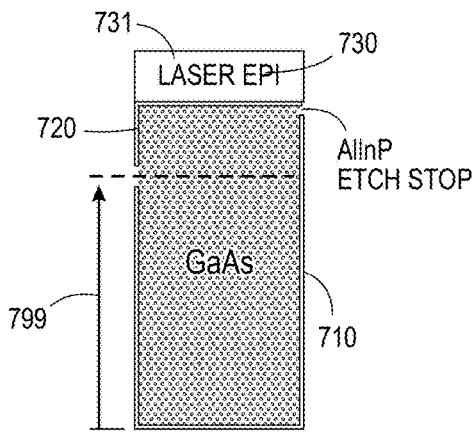
FIGS. 7A through 7C illustrate processing steps for making the article comprising the GaAs laser heterostructure epilayers of FIG. 6A bonded to a chemically tempered glass substrate.
Figure 7B:
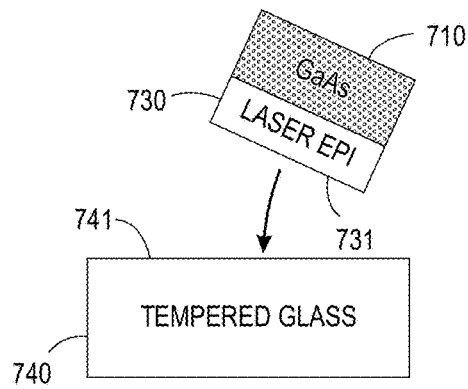
Figure 7C:
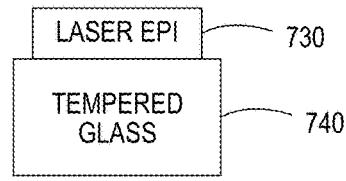

FIGS. 7A through 7C illustrate processing steps for making the article comprising the GaAs laser heterostructure epilayers of FIG. 6A bonded to a chemically tempered glass substrate. FIG. 7A shows the GaAs growth substrate with the GaAs laser heterostructure epilayers 730 grown on the substrate 710. The direction of epitaxial growth of the heterostructure epilayers 730 is toward the surface 731. An AlInP etch stop layer 720 was disposed between the GaAs substrate 710 and the heterostructure epilayers 730. As depicted in FIG. 7A, the GaAs substrate 710 was first thinned to 100 µm (arrow 799) using mechanical polishing. As shown in FIG. 7B, the surface 731 of the heterostructure epilayers 730 was placed directly on the bonding surface 741 of the glass substrate 740. FIG. 7B shows the GaAs substrate 710 which has been thinned. The heterostructure epilayers 730 were then directly bonded to the chemically tempered glass substrate by applying a voltage between the glass 740 and the GaAs substrate 710. The glass was engineered with a chemical tempering process (as described above with reference to FIGS. 5A-5E) that resulted in the infusion of potassium ions at the glass bonding surface 741. The applied voltage induced ion exchange across the interface between the bonding surface 741 and the surface 731 of the heterostructure epilayers, causing the two surfaces to form chemical bonds at the interface. The bonding process was performed at a temperature of 350 to 400° C. with a voltage of 500 to 800 V applied for about 3 minutes of hold time. The parameters chosen depended on the thickness and doping levels of the samples and were optimized for each article tested.

After bonding, the GaAs growth substrate was completely removed using chemical jet etching, leaving just the 2.6 µm epilayers bonded on the glass. The etchant used was a $20H_2O_2$:1 $NH_4OH$ solution with of $NH_4OH$ added into the solution until the pH reached about 8.3. The jet etching system used incorporates a nozzle for spraying the etchant on the sample. The spray was powered via a chemical pump that circulated the etchant around the system. The chemical etching stopped at a thin AlInP etch stop layer grown between the GaAs substrate and the laser active region, and smooth and shiny heterostructure epilayers emerged after the substrate removal process. FIG. 7C is a diagram that illustrates the final article.

Figure 8A:
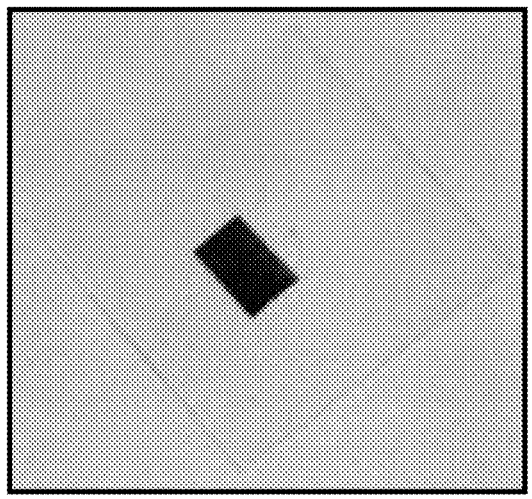
FIG. 8A shows an optical image of the transferred heterostructure epilayers.
Figure 8B:
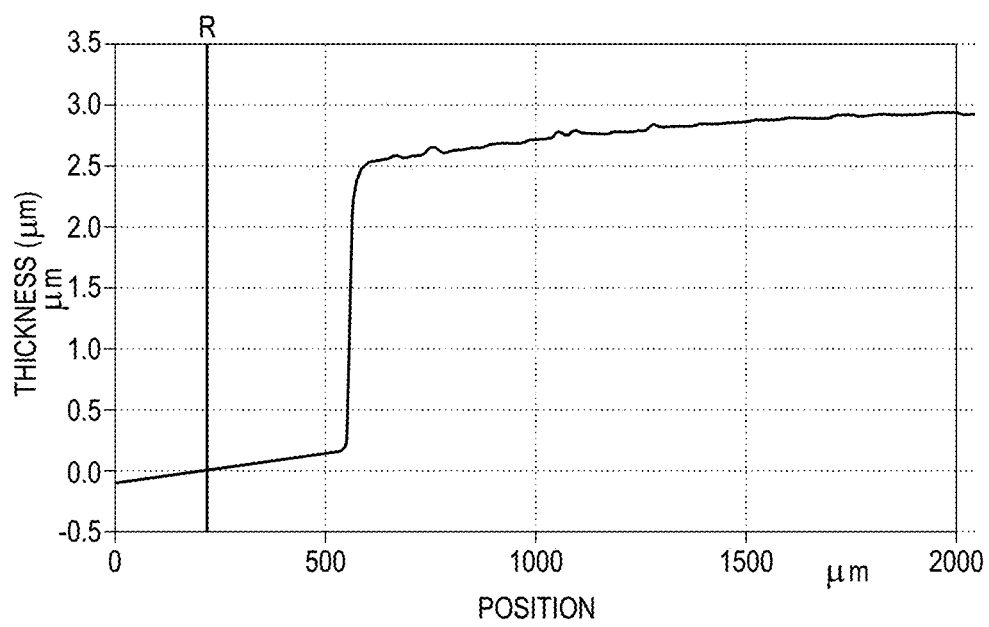
FIG. 8B shows a thickness profile scan across the heterostructure epilayers.

FIG. 8A shows an optical image of the transferred heterostructure epilayers. FIG. 8B shows a thickness profile scan across the heterostructure epilayers.

Figure 9A:
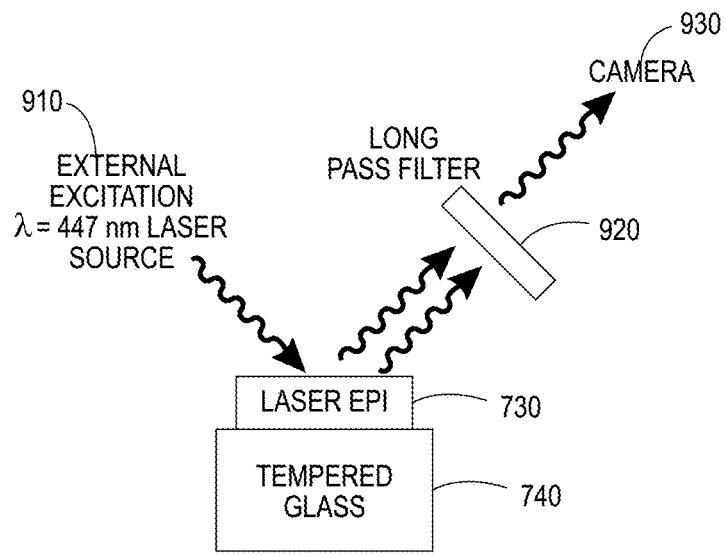
FIG. 9A shows an illustration of the photoluminescence setup used to test the operation of the transferred epilayers.
Figure 9B:
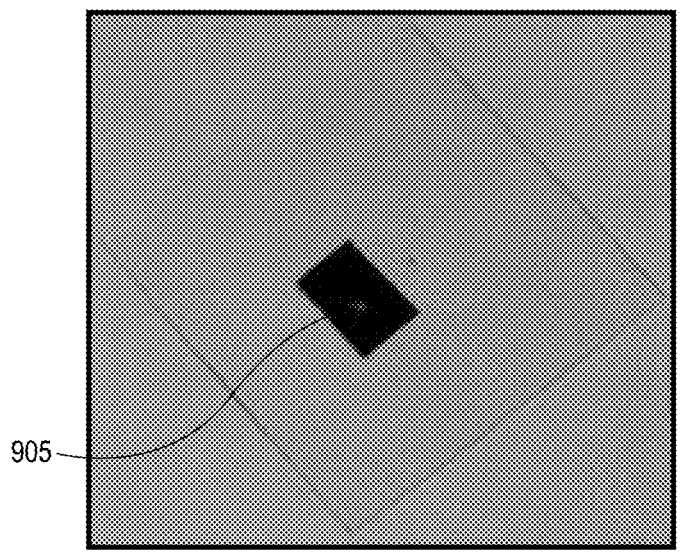
FIG. 9B shows a camera image of the excited sample.

After the transfer of the epilayers, laser source was used to excite the quantum wells to check whether the transferred heterostructure epilayers remained optically active. FIG. 9A shows an illustration of the photoluminescence setup used to test the operation of the transferred epilayers. The setup included an external laser excitation source 910 emitting at $\lambda=447$ nm, a long pass filter 920 disposed in the path of the output light emitted by the heterostructure epilayers 730 and a camera 930. FIG. 9B shows a camera image of the excited sample. The red spot 905 in FIG. 9B indicates that the red laser heterostructure epilayers 730 remained optically active after the transfer process.

Figure 10:
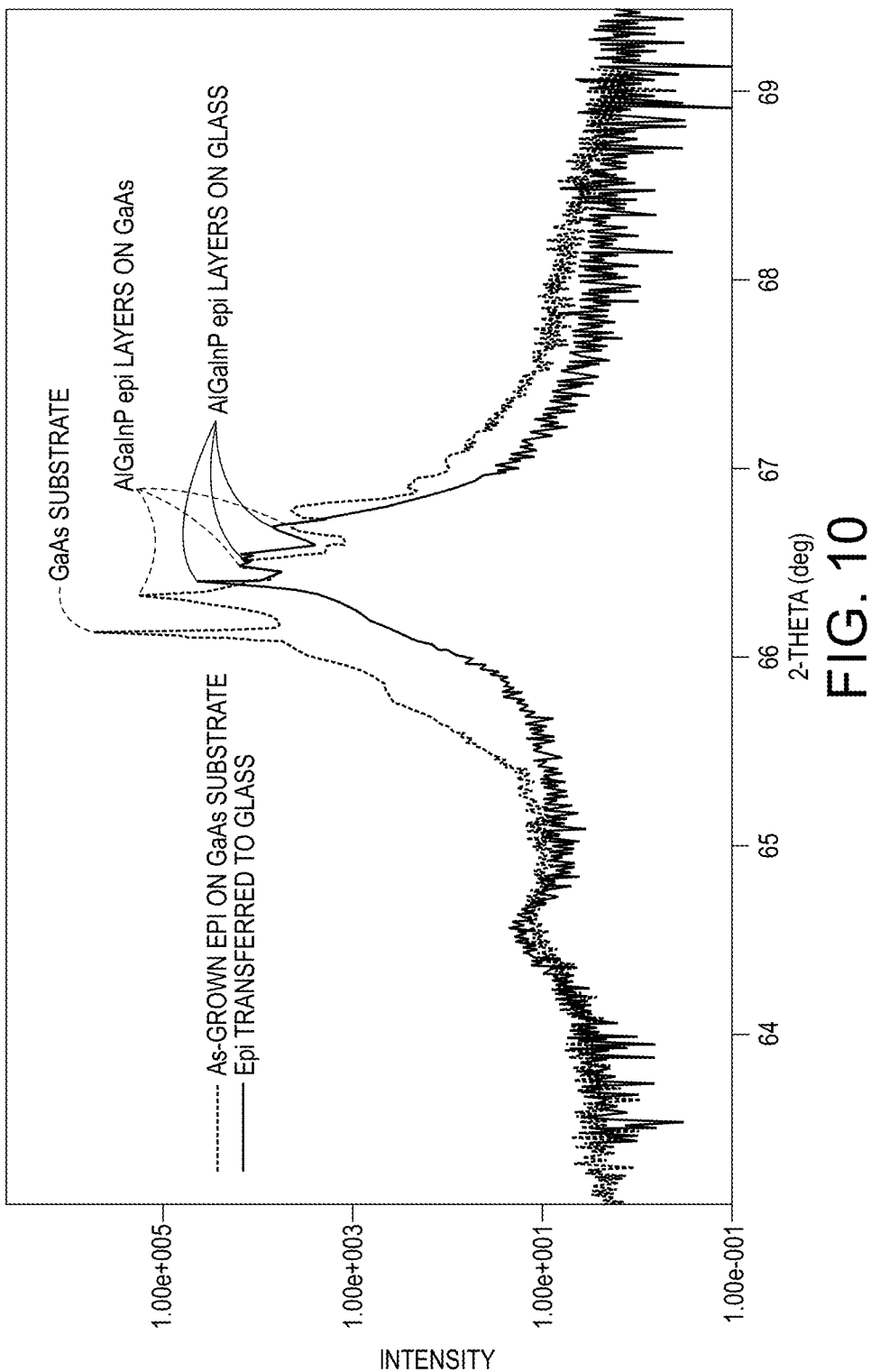
FIG. 10 shows $\Omega$-$2\theta$ scans comparing the before transfer and after transfer x-ray diffraction characteristics of the heterostructure epilayers.

X-ray diffraction characterization was performed before and after transfer of the heterostructure epilayers. FIG. 10 shows $\Omega$-$2\theta$ scans comparing the before transfer and after transfer x-ray diffraction characteristics of the heterostructure epilayers. The disappearance of the GaAs x-ray peak in the diffraction spectrum of the transferred sample indicates that the native GaAs growth substrate was completely removed. Also, the remaining x-ray peaks show no linewidth broadening. This suggests that the integrity of the laser epilayer structure was maintained during the transfer process, and that degradation in crystal quality, if any, was insignificant. The shifts in the x-ray peaks were due to strain relaxations after substrate removal.

Figure 11A:
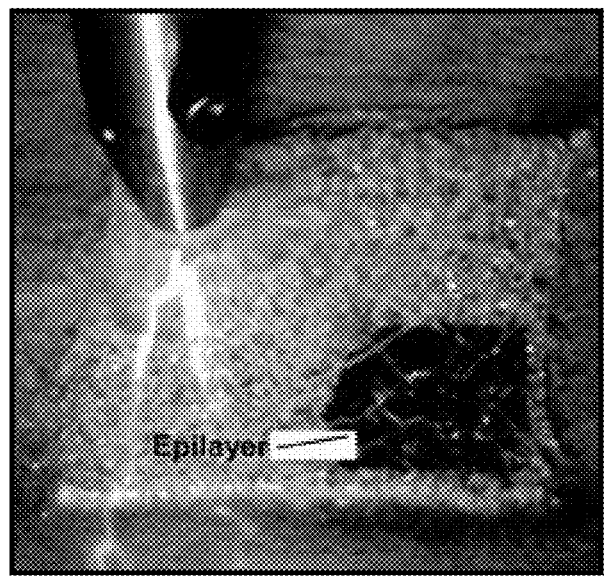
FIGS. 11A and 11B show two time lapse images during the break-up of the transferred GaAs-based heterostructure epilayers when a mechanical impact caused the glass support substrate to shatter.
Figure 11B:
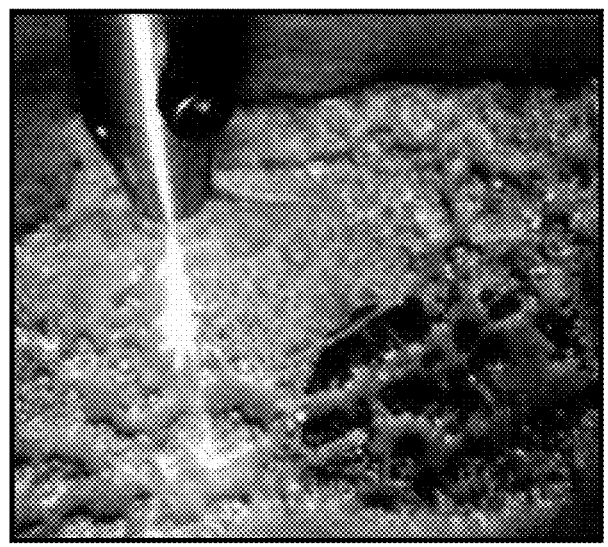

FIGS. 11A and 11B show two time lapse images during the break-up of the transferred GaAs-based heterostructure epilayers when a mechanical impact caused the glass support substrate to shatter. FIGS. 11A and 11B show that the bonding process was sufficient to cause the heterostructure epilayers to fracture together with the underlying support substrate as desired.

Example 2

Figure 12A:
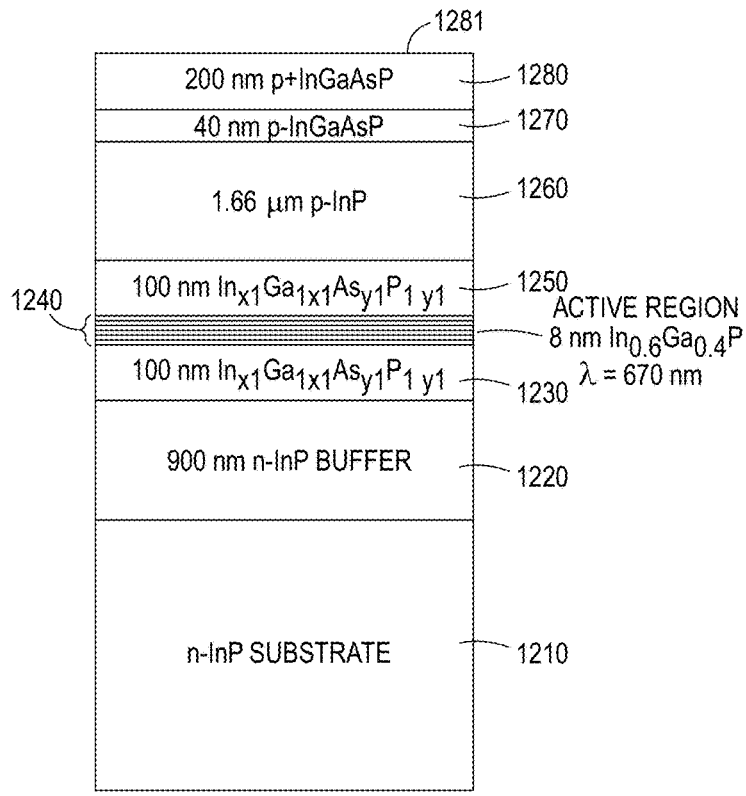
FIG. 12A depicts the layers of an InP-based infra-red-emitting semiconductor laser heterostructure grown on a InP growth substrate.
Figure 12B:
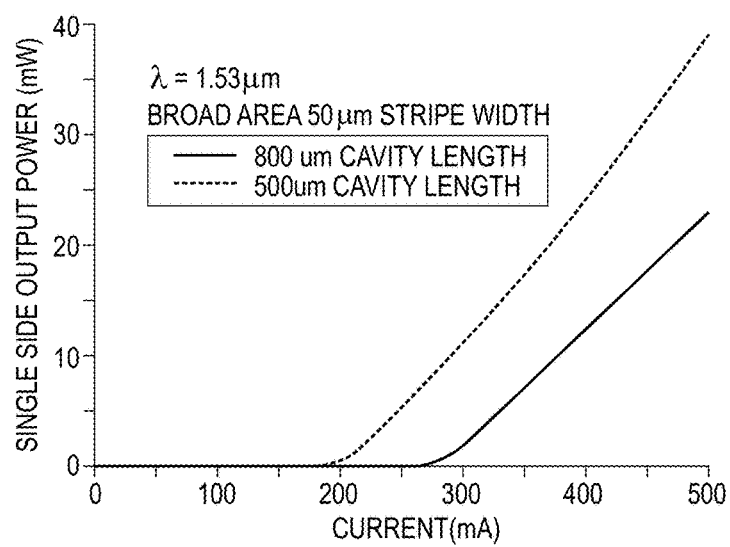
FIG. 12B shows the light versus current curves of two laser diodes fabricated using the heterostructure epilayers of FIG. 12A.

In example 2, an InP-based infra-red-emitting semiconductor laser heterostructure was fabricated. The heterostructure epilayers 1220-1280 shown in FIG. 12A were grown on a 400 µm-thick InP growth substrate 1210 by MOCVD. The heterostructure epilayers included: a 900 nm n-InP buffer layer 1220; a 100 nm $In_{x1}Ga_{1-x1}As_{y1}P_{1-y1}$ layer 1230; an active region 1240 comprising 6 InGaAsP active layers (5 nm each) with 10 nm barrier layers designed to operate at the telecom wavelength of $\lambda=1.53$ µm; a 100 nm $In_{x1}Ga_{1-x1}As_{y1}P_{1-y1}$ layer 1250; a 1.66 µm p-InP layer 1260; a 40 nm p-InGaAsP layer 1270; and a 200 nm p+ InGaAs layer 1280. The total thickness of the heterostructure epilayers 1220-1280 was about 2.5 µm. FIG. 12B shows the light (single side output power mW) versus current curves of two laser diodes fabricated using the heterostructure epilayers. The first laser diode has a 800 µm cavity length and the second laser diode has a 500 µm cavity length. The output light from each of the laser diodes was $\lambda=1.53$ µm with a broad area 50 µm stripe width.

In example 2, the InP growth substrate was first thinned to 200 µm using mechanical polishing. The surface 1281 of the heterostructure epilayers was then directly bonded to the bonding surface of the chemically tempered glass support substrate by applying a voltage between the glass and the InP substrate. The bonding process was performed at a temperature of 350 to 400° C. with a voltage of 500 to 800 V applied for about 3 minutes of hold time.

After bonding the heterostructure epilayers, the InP substrate was completely removed using selective chemical etching, leaving just the 2.5 μm epilayers bonded on the glass. A 3 HCl:1H$_2$O solution was used as the etch chemical. The chemical etching stopped at a thin InGaAsP etch stop layer grown between the InP substrate and the laser active region, and smooth and shiny heterostructure epilayers emerged after the substrate removal process.

Figure 13A:
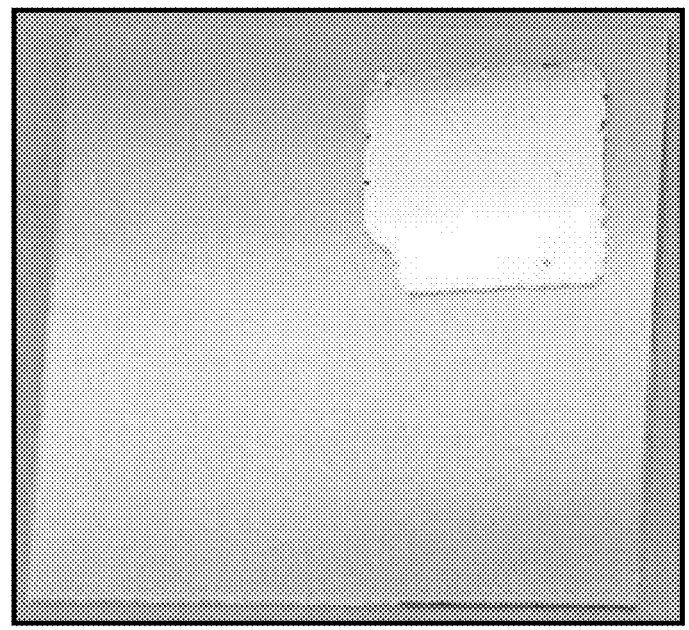
FIG. 13A shows an optical image of the transferred heterostructure epilayers.
Figure 13B:
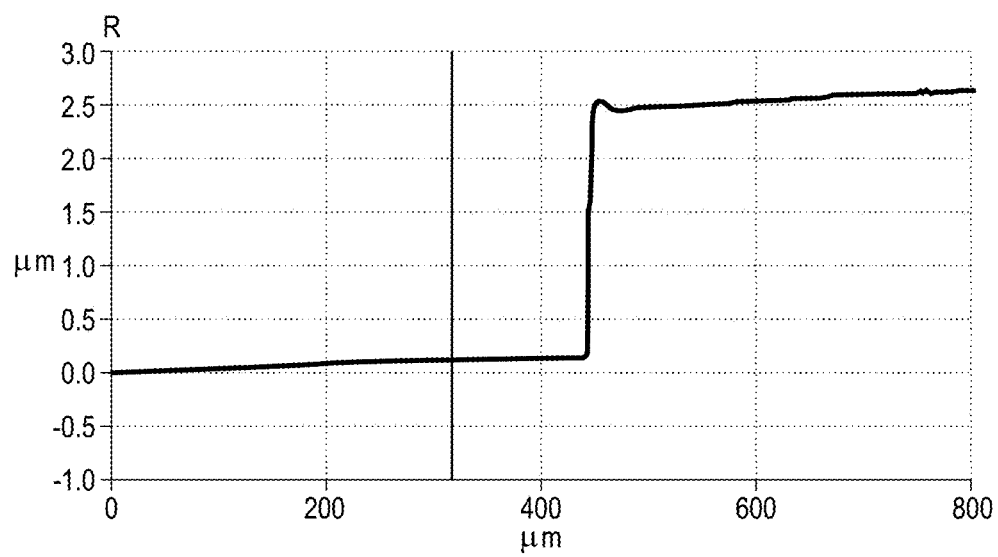
FIG. 13B shows a thickness profile scan across the epilayers.
Figure 14:
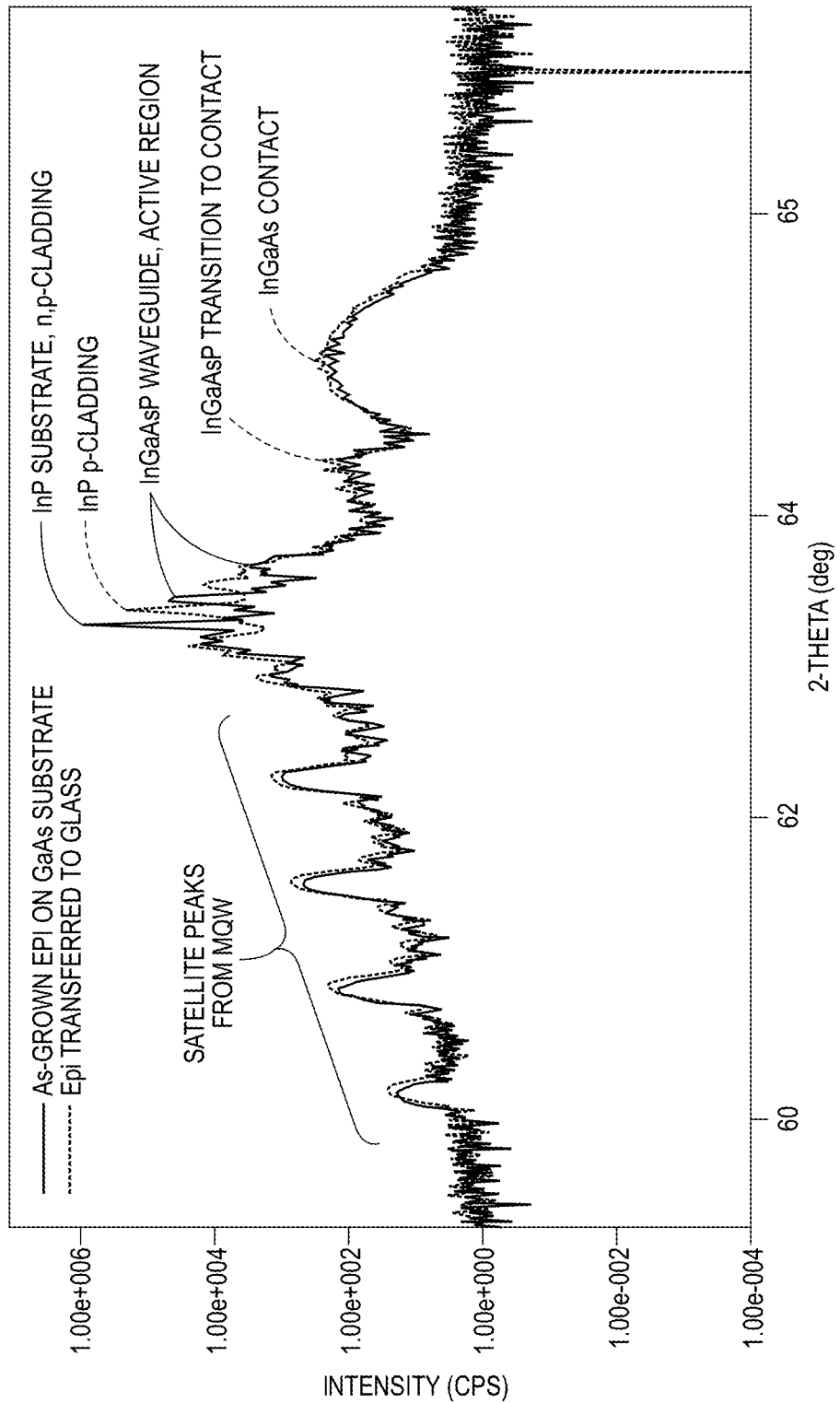
FIG. 14 shows $\Omega$-$2\theta$ scans comparing the before transfer and after transfer x-ray diffraction characteristics of the heterostructure epilayers.

FIG. 13A shows an optical image of the transferred heterostructure epilayers. FIG. 13B shows a thickness profile scan across the epilayers. X-ray diffraction characterization was performed before and after transfer of the heterostructure epilayers. FIG. 14 shows Ω-2θ scans comparing the before transfer and after transfer x-ray diffraction characteristics of the heterostructure epilayers. The x-ray peaks from the transferred epilayers matched those from the epilayers prior to the transfer, indicating that the epilayers were transferred in entirety. The absence of linewidth broadening in the peaks suggests that the transferred InP-based epilayers did not suffer degradation in crystal quality. The shifts in the x-ray peaks were due to strain relaxations after substrate removal.

Figure 15A:
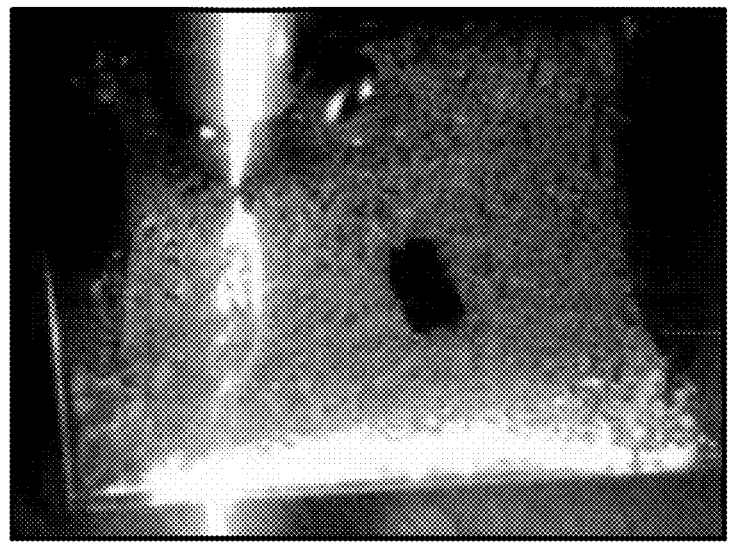
FIGS. 15A and 15B show two time lapse images during the break-up of the transferred InP-based heterostructure epilayers when a mechanical impact caused the glass support substrate to shatter.
Figure 15B:
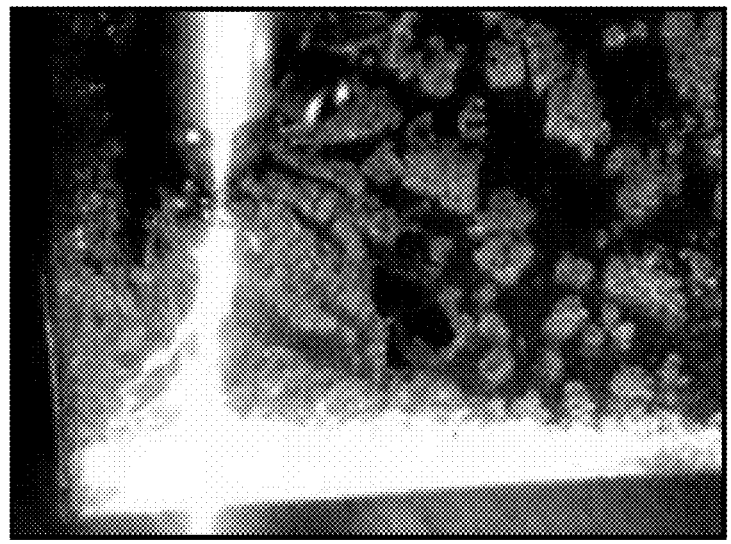

FIGS. 15A and 15B show two time lapse images during the break-up of the transferred InP-based epilayers when a mechanical impact caused the chemically tempered glass support substrate to shatter. FIGS. 15A and 15B confirm that bonding process was sufficient to result in the epilayers and the underlying glass support substrate powderizing together as desired.

Example 3

Figure 16A:
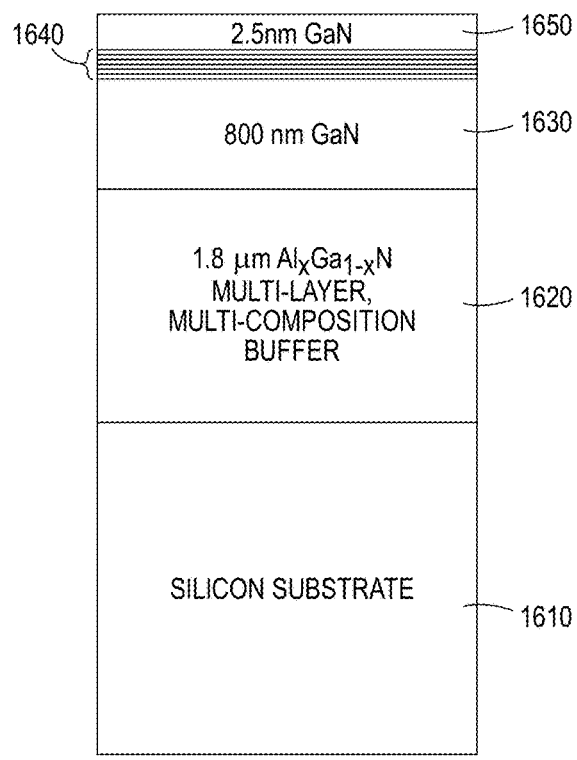
FIG. 16A shows GaN-based high electron mobility transistor (HEMT) heterostructure epilayers grown on a Si substrate.

In example 3, GaN-based high electron mobility transistor (HEMT) heterostructure epilayers were bonded to tempered glass substrates. The heterostructure epilayers were grown on a 600 μm-thick Si substrate by MOCVD, and featured a GaN/AlGaN heterojunction for confining electron gas during device operation. FIG. 16A shows a diagram of the heterostructure epilayers 1620-1650 grown on the 600 μm silicon growth substrate 1610. The heterostructure epilayers include a 1.8 μm AlxGa1-xN multi-layer, multi-composition buffer 1620; an 800 nm GaN layer 1630, an 18 nm Al$_{0.27}$Ga$_{0.73}$N layer 1640; and a 2.5 nm GaN layer 1650. The total thickness of the heterostructure epilayers 1620-1650 was about 2.8 μm.

Figure 16B:
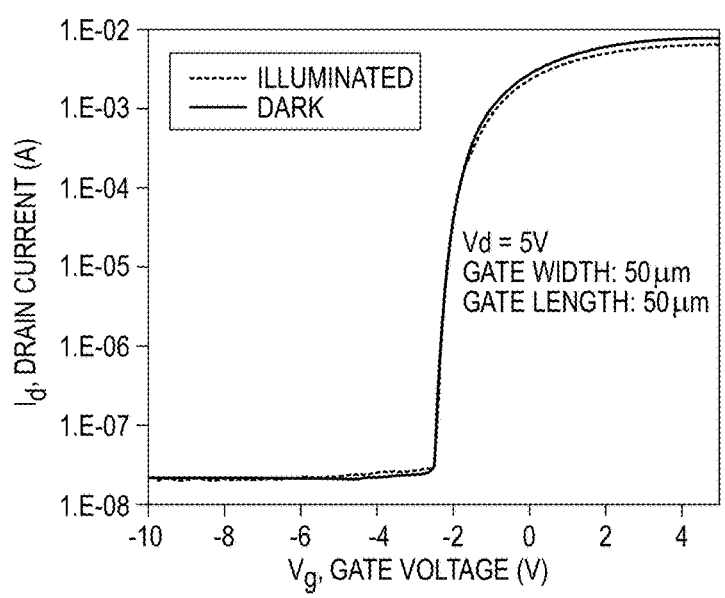
FIG. 16B shows the drain current versus gate voltage curves of transistors fabricated using the heterostructure epilayers illustrated in FIG. 16A.

FIG. 16B shows the drain current versus gate voltage curves of transistors fabricated using the heterostructure epilayers illustrated in FIG. 16A. In this example, the Si growth substrate 1610 was first thinned to 100 μm using mechanical polishing. The topmost GaN layer 1650 was undoped and electrically insulating, so a conductive intermediate layer comprising a thin 100 nm layer of electrically conductive aluminum was evaporated on the heterostructure epilayers to assist with bonding. The heterostructure epilayers were placed on the chemically tempered glass with the Al layer directly on the bonding surface. The Al-capped heterostructure epilayers 1620-1650 were then bonded on the chemically tempered glass by applying a voltage between the glass and the Si substrate.

The bonding process was performed at a temperature of 350 to 400° C. with a voltage of 800 to 1200 V applied for 3 to 5 minutes of hold time. In alternative embodiments, a doped top-most epilayer, such as p-GaN, p-InGaN, p-AlGaN, or p-InAlGaN, could be grown as part of the heterostructure to eliminate the need for a conductive intermediate layer. A p-doped layer could also be used along with the conductive intermediate layer.

After the bonding, the Si substrate was completely removed using selective SF6 inductively-coupled plasma (ICP) dry etching, leaving just the 2.8 μm heterostructure epilayers bonded on the glass. The plasma etching stopped at an AlGaN etch stop layer grown between the Si substrate and the transistor heterojunction, and smooth and shiny epilayers emerged after the substrate removal process.

Figure 17A:
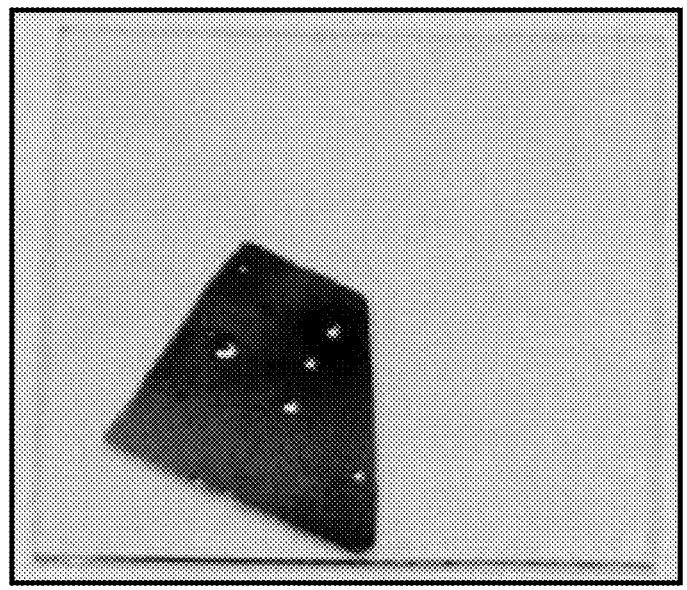
FIG. 17A shows an optical image of the transferred heterostructure epilayers.
Figure 17B:
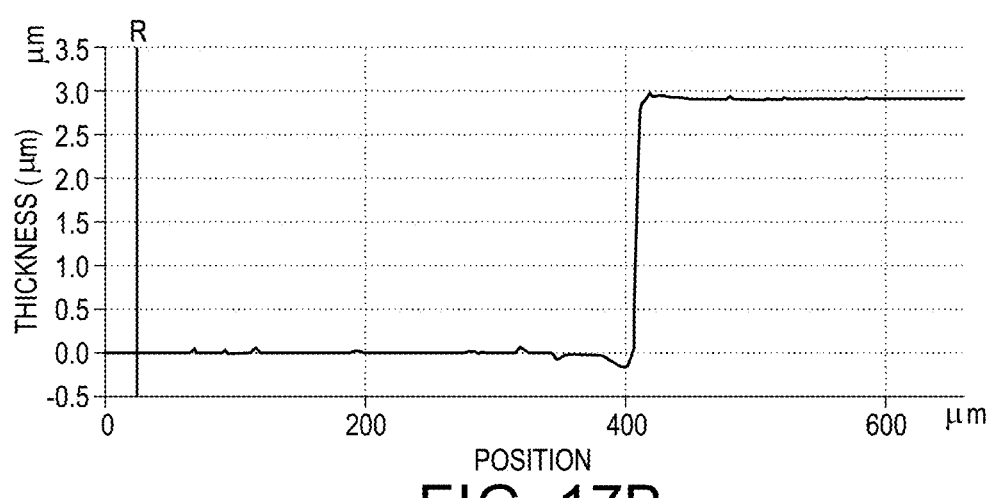
FIG. 17B shows a thickness profile scan across the heterostructure epilayers.
Figure 18:
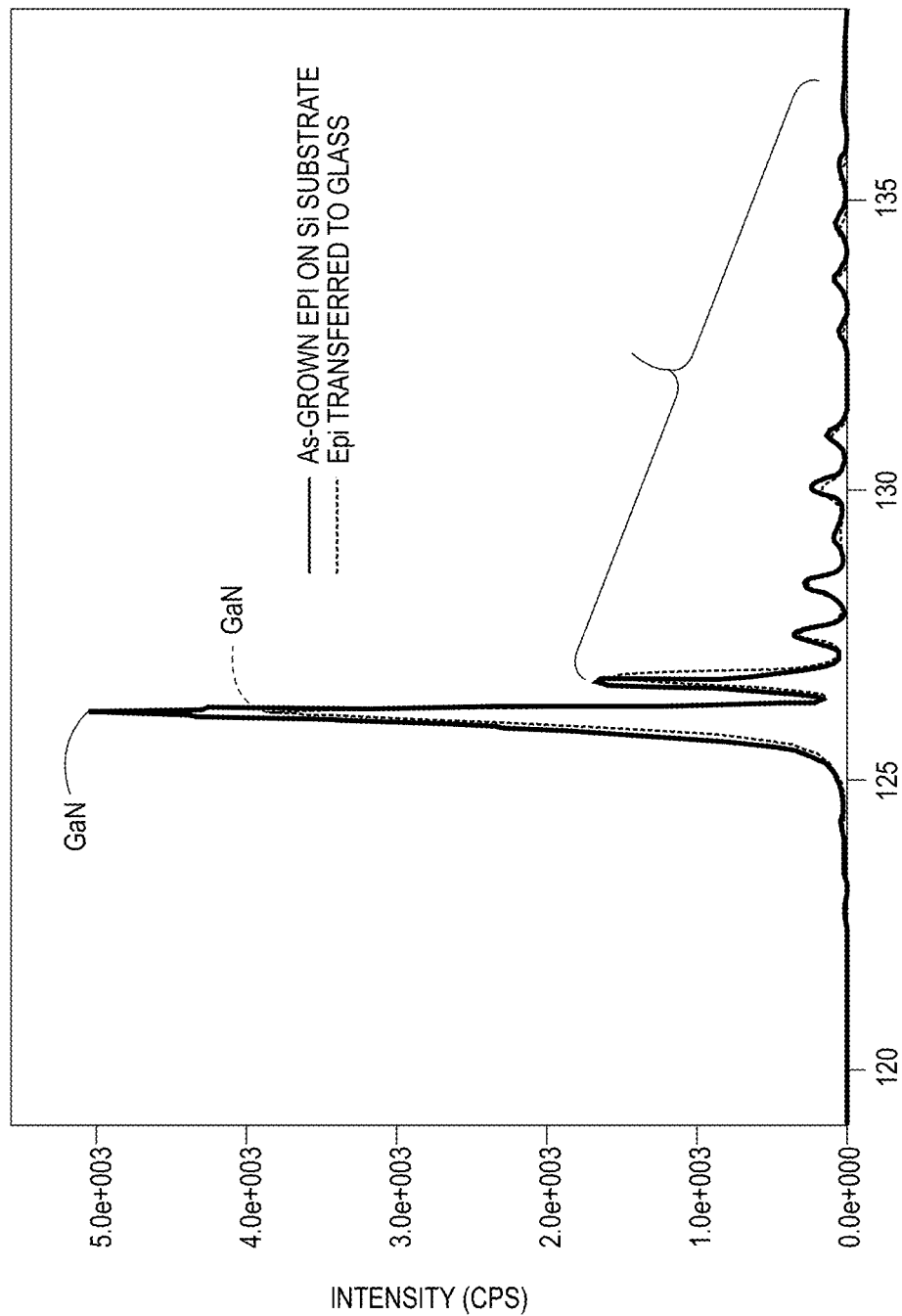
FIG. 18 shows $\Omega$-$2\theta$ scans comparing the before transfer and after transfer x-ray diffraction characteristics of the heterostructure epilayers.

FIG. 17A shows an optical image of the transferred heterostructure epilayers. FIG. 17B shows a thickness profile scan across the heterostructure epilayers. X-ray diffraction characterization before and after transfer and bonding of the heterostructure epilayers was performed. FIG. 18 shows Ω-2θ scans comparing the before transfer and after transfer x-ray diffraction characteristics of the heterostructure epilayers. The peak positions were nearly identical, indicating that the heterostructure epilayers were transferred in entirety and that there was no significant change in strain states. The absence of linewidth broadening in the peaks suggests that the transferred GaN-based epilayers did not suffer degradation in crystal quality.

Figure 19A:
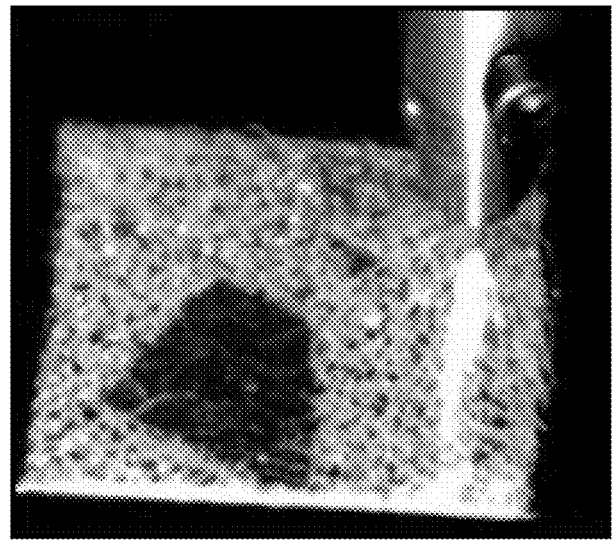
FIGS. 19A and 19B show time lapse images during the break-up of the transferred GaN-based heterostructure epilayers when a mechanical impact caused the chemically-tempered glass support substrate to shatter.
Figure 19B:
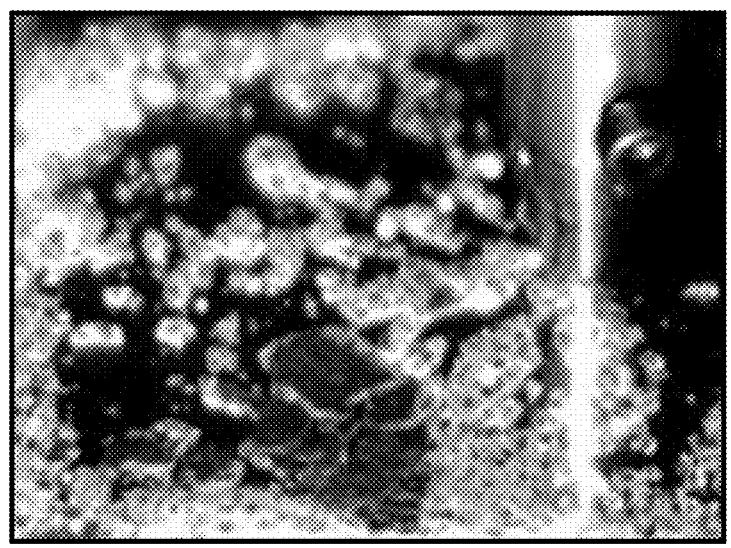

FIGS. 19A and 19B show time lapse images during the break-up of the transferred GaN-based heterostructure epilayers when a mechanical impact caused the chemically-tempered glass support substrate to shatter. FIGS. 19A and 19B illustrate that the bonding process was sufficient, so the heterostructure epilayers fractured together with the underlying glass support substrate as desired.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. An article, comprising:
   a support substrate having bonding surface; and
   heterostructure epitaxial layers that include one or more electronic devices, the heterostructure epitaxial layers having a surface and an epitaxial growth direction towards the surface, the heterostructure epitaxial layers bonded to the support substrate at the surface of the heterostructure epitaxial layers by ion exchange between the surface of the heterostructure epitaxial layers and the bonding surface of the support substrate, wherein the support substrate and the heterostructure epitaxial layers are configured to powderize together in response to a trigger.

2. The article of claim 1, wherein the heterostructure epitaxial layers are less than 10 µm thick.

3. The article of claim 1, wherein the electronic devices comprise one or more of a laser diode, a light-emitting diode, a diode, a transistor, a photodetector, a light guide, a semiconductor optical amplifier, an electronic switch, a field-effect device, and a modulator.

4. The article of claim 1, wherein the electronic devices comprise one or more of GaAs, InP, Si, and GaN-based electronic devices.

5. The article of claim 1, wherein the support substrate is chemically tempered glass.

6. The article of claim 1, wherein a growth substrate used to grow the heterostructure epitaxial layers is absent from the article.

7. The article of claim 1, further comprising an electrically conductive intermediate layer having a thickness less than about 1 µm is disposed between the surface of the heterostructure epitaxial layers and the bonding surface of the support substrate.

8. The article of claim 7, wherein:
the surface of the heterostructure epitaxial layers is undoped or lightly doped; and
the intermediate layer is electrically conductive.

9. The article of claim 1, wherein the heterostructure epitaxial layers include an etch stop layer.

10. The article of claim 1, further comprising a trigger device disposed on the support substrate, the trigger device configured to generate and apply an initial fracture force on the support substrate.

11. The article of claim 10, wherein the support substrate is configured such that secondary fractures are generated in the support substrate in response to the initial fracture force and the secondary fractures propagate through and powderize the support substrate and the heterostructure epitaxial layers.

12. A method, comprising:
epitaxially growing heterostructure epitaxial layers on a growth substrate along a growth direction towards a surface of the heterostructure epitaxial layers;
placing the surface of the heterostructure epitaxial layers on or near an ion rich bonding surface of a support substrate;
bonding the heterostructure epitaxial layers to the support substrate by ion exchange between the bonding surface of the support substrate and the surface of the heterostructure epitaxial layers;
applying at least one of heat and voltage during the bonding; and
removing the growth substrate, wherein the support substrate and the heterostructure epitaxial layers are configured to powderize together in response to a trigger.

13. The method of claim 12, wherein removing the growth substrate comprises completely removing the growth substrate leaving only the heterostructure epitaxial layers bonded to the support substrate.

14. The method of claim 12, wherein a thickness of the heterostructure epitaxial layers is less than about 10 µm thick.

15. The method of claim 12, wherein the support substrate is or comprises chemically tempered, glass.

16. The method of claim 12, wherein epitaxially growing the heterostructure epitaxial layers comprises forming one or more electronic devices in the heterostructure epitaxial layers.

17. The method of claim 12, wherein forming the electronic devices comprises forming one or more GaAs, InP, Si, and GaN-based electronic devices.

18. The method of claim 12, further comprising forming a trigger device on the support substrate, the trigger device configured to generate and apply an initial fracture force on the support substrate in response to a trigger input.

19. The method of claim 12, further comprising:
disposing an intermediate layer on the heterostructure epitaxial layers;
wherein placing the surface of the heterostructure epitaxial layers on or near the bonding surface comprises placing the intermediate layer on the bonding surface of the support substrate.

20. The method of claim 19, wherein the intermediate layer is electrically conductive.

21. The method of claim 12, wherein applying at least one of heat and voltage during the bonding comprises heating the heterostructure layers and the support substrate during the bonding and applying a voltage between the surface of the heterostructure epitaxial layers and the bonding surface during the bonding.

* * * * *